United States Patent
Yamamoto

(12) 
(10) Patent No.: US 6,624,095 B1
(45) Date of Patent: Sep. 23, 2003

(54) METHOD FOR MANUFACTURING A SEMICONDUCTOR DEVICE

(75) Inventor: Hirohisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/613,690

(22) Filed: Jul. 10, 2000

(30) Foreign Application Priority Data

Feb. 2, 2000 (JP) ........................................ 2000-025564

(51) Int. Cl.⁷ ............................................... H01L 21/26
(52) U.S. Cl. ..................................................... 438/795
(58) Field of Search ................................ 438/795, 660, 438/663, 905, 909

(56) References Cited

U.S. PATENT DOCUMENTS

| | | | | |
|---|---|---|---|---|
| 5,135,608 A | * | 8/1992 | Okutani | 156/643 |
| 5,286,296 A | * | 2/1994 | Sato et al. | 118/719 |
| 5,401,669 A | * | 3/1995 | Falster et al. | 437/12 |
| 5,578,132 A | * | 11/1996 | Yamaga et al. | 118/724 |
| 5,829,939 A | * | 11/1998 | Iwai et al. | 414/411 |
| 5,853,486 A | * | 12/1998 | Ono et al. | 118/719 |
| 6,031,205 A | * | 2/2000 | Shimaru | 219/390 |

* cited by examiner

Primary Examiner—Hoai Ho
Assistant Examiner—Quoc Hoang
(74) Attorney, Agent, or Firm—McDermott, Will & Emery

(57) ABSTRACT

A wafer 38 having an exposed portion of silicon is transferred to a treatment chamber for lamp annealing. The atmosphere of the treatment chamber 32 is converted to a reduced pressure atmosphere (500 Torr) of an inert gas ($N_2$). The wafer 38 is subjected to lamp annealing in the reduced pressure atmosphere of the inert gas (1050° C., 30 seconds).

6 Claims, 2 Drawing Sheets ed in the course of lamp annealing. To this end, it is considered that the lamp annealing is performed within a treatment chamber whose inside is kept in vacuum.

METHOD FOR MANUFACTURING A SEMICONDUCTOR DEVICE

BACKGROUND OF THE INVENTION

1. Field of the Invention

The present invention relates to a method for manufacturing a semiconductor device, and more particularly, to a thermal treating method of a silicon wafer.

2. Description of the Background Art

As a semiconductor device is miniaturized, the time of thermal treatment applicable to the semiconductor device is shortened in recent years. To this end, rapid thermal annealing (RTA), typical of which is lamp annealing, has now been in wide use to thermally treat a semiconductor device. According to RTA, a semiconductor device is, for example, subjected to thermal annealing at a high temperature exceeding 1000° C. within a short time, by which a desired thermal annealing effect can be expected without damaging the semiconductor device.

The thermal treatment for a semiconductor device may be sometimes carried out in such a state that silicon is exposed at the surface of a wafer. In the step of forming a transistor, for example, after a gate electrode, which includes a built-up film of a doped polysilicon (D-poly film) and a tungsten silicide film (W-Si film), has been formed on a gate insulating film, the thermal treatment may be carried out under such conditions that the D-poly film and the W-Si film are exposed at the side surfaces of the gate electrode.

When a check is made for the surface condition of the wafer in which silicone is exposed at the surface thereof after thermal treatment at high temperatures of 1000° C. or over according to lamp annealing, it has been found that a number of minute foreign matters with a diameter of approximately 0.1 $\mu$m are observed on the wafer surface. Such minute foreign matters will cause the failure of a semiconductor device if the further scale down of the device is intended.

SUMMARY OF THE INVENTION

It is accordingly an object of the invention to provide a method for manufacturing a semiconductor device, which overcomes the problems involved in the prior art.

It is another object of the invention to provide a method for manufacturing a semiconductor device wherein a wafer having exposed silicon at the surfaces thereof is thermally treated without causing the occurrence of minute foreign matters.

The above objects of the present invention are achieved by a method for manufacturing a semiconductor device described below. In the method, there is transferred a wafer having an exposed portion of silicon to a thermal treatment chamber. An atmosphere of the thermal treatment chamber is converted to a reduced pressure atmosphere of an inert gas. The wafer is subjected to thermal treatment in the reduced pressure atmosphere of an inert gas Other objects and further features of the present invention will be apparent from the following detailed description when read in conjunction with the accompanying drawings.

DESCRIPTION OF THE PREFERRED EMBODIMENTS

Figure 1:
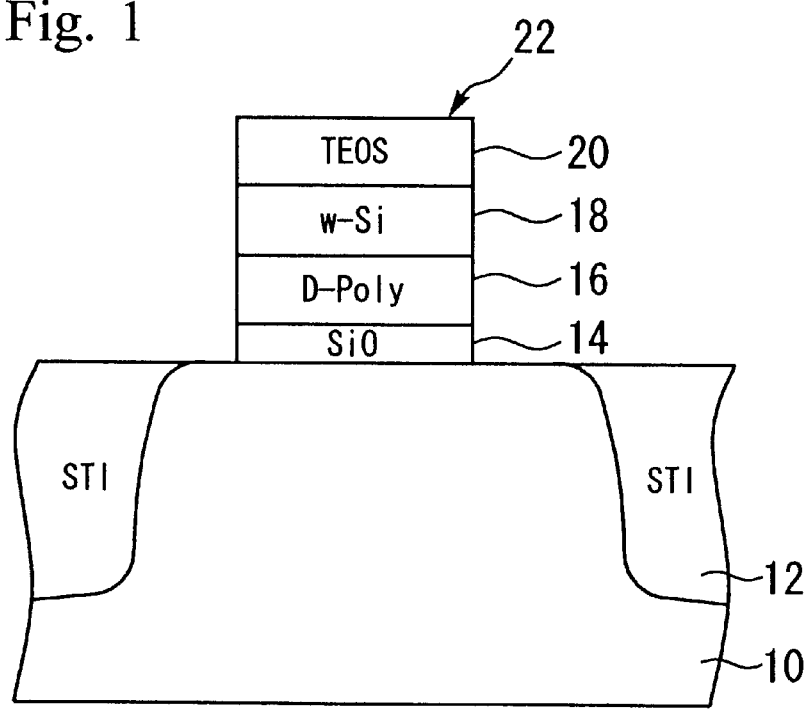
FIG. 1 is a sectional view showing a wafer which is to be thermally treated in a first embodiment of the invention.

In the following, principles and embodiments of the present invention will be described with reference to the accompanying drawings. The members and steps that are common to some of the drawings are given the same reference numerals and redundant descriptions therefor may be omitted.

First embodiment

FIG. 1 is a sectional view of a wafer which is subjected to thermal treatment in a first embodiment of the invention. The sectional view of FIG. 1 shows one state during the course of forming a transistor.

In the course of the formation of a transistor, an isolation region (STI: shallow trench isolation) 12 is initially formed in a silicon substrate 10. Thereafter, a gate oxide film 14, a D-poly film 16, a W-Si film 18 and a TEOS oxide film 20 are successively formed over the entire surface of the silicon substrate 10. The resultant built-up film is subjected to patterning according to photolithography and etching, thereby forming a gate electrode 22 surrounded with the STI 12 as shown in FIG. 1.

After completion of the pattern of the gate electrode 22 during the formation of the transistor, thermal treatment for the purpose of activating an impurity may be performed. In this case, the thermal treatment is carried out in such a state that the side surfaces of the D-poly film 16 and the W-Si film 18 are exposed to the side surface of the gate electrode 22, i.e. silicon is exposed at the side surface of the gate electrode 22.

Figure 2:
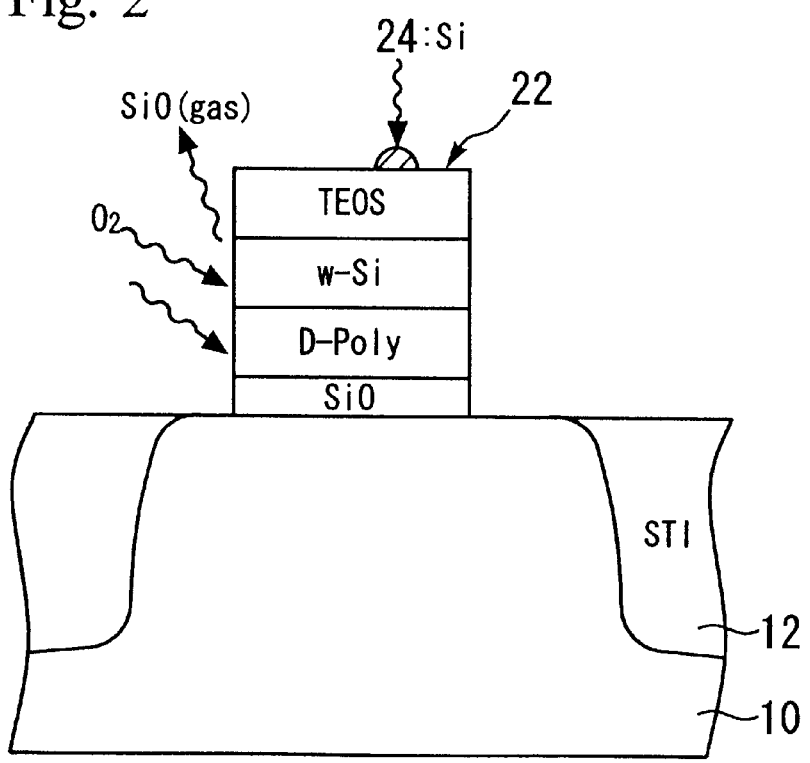
FIG. 2 is an illustrative view showing a phenomenon when the wafer of FIG. 1 is subjected to ordinary lamp annealing.

FIG. 2 is a view illustrating the phenomenon that occurs when the wafer shown in FIG. 1 is subjected to conventional lamp annealing. The lamp annealing conditions include, for example, an annealing temperature of 1050° C. and an annealing time of 30 seconds. It should be noted that the annealing operation is performed within a treatment chamber of an $N_2$ atmosphere.

As is known in the art, when lamp annealing is performed under such conditions as mentioned above, residual oxygen left in a small amount within the treatment chamber reacts with the silicon exposed at the side surfaces of the gate electrode, with the result that etched silicon is sublimated in the form of SiO. This phenomenon is set out, for example, in "Reaction of Oxygen with Si (111) and (100): Critical Conditions for the Growth of $SiO_2$/J. Electrochem. Soc.: Solid State and Technology". When the wafer with exposed silicon is subjected to lamp annealing, the SiO formed in this way is deposited on the wafer surface, thereby forming a silicon-based minute foreign matter 24 as shown in FIG. 2.

In order to suppress the production of the minute foreign matter 24, it is effective to reduce residual oxygen in the treatment chamber within which the wafer is accommodated. The residual oxygen in the treatment chamber can be reduced by thorough purge using $N_2$ gas. However, if a period for the purge using $N_2$ is prolonged, the treating capacity of the thermal treating apparatus lowers. Further, a large amount of moisture is brought into the treatment chamber together with a wafer itself. In practice, it is thus difficult to completely remove residual oxygen within the treatment chamber through purge using $N_2$.

In this embodiment of the invention, the annealing treatment in an atmosphere of $N_2$, which has been conventionally conducted at an atmospheric pressure, is performed in an atmosphere of reduced pressure. When the pressure in the treatment chamber is lowered, it can be possible to efficiently reduce the amount of residual oxygen within a short time. Hence, according to the method embodying the invention, the amount of an SiO gas produced during the course of annealing can be suppressed, thereby suppressing the production of the minute foreign matter 24.

Figure 3:
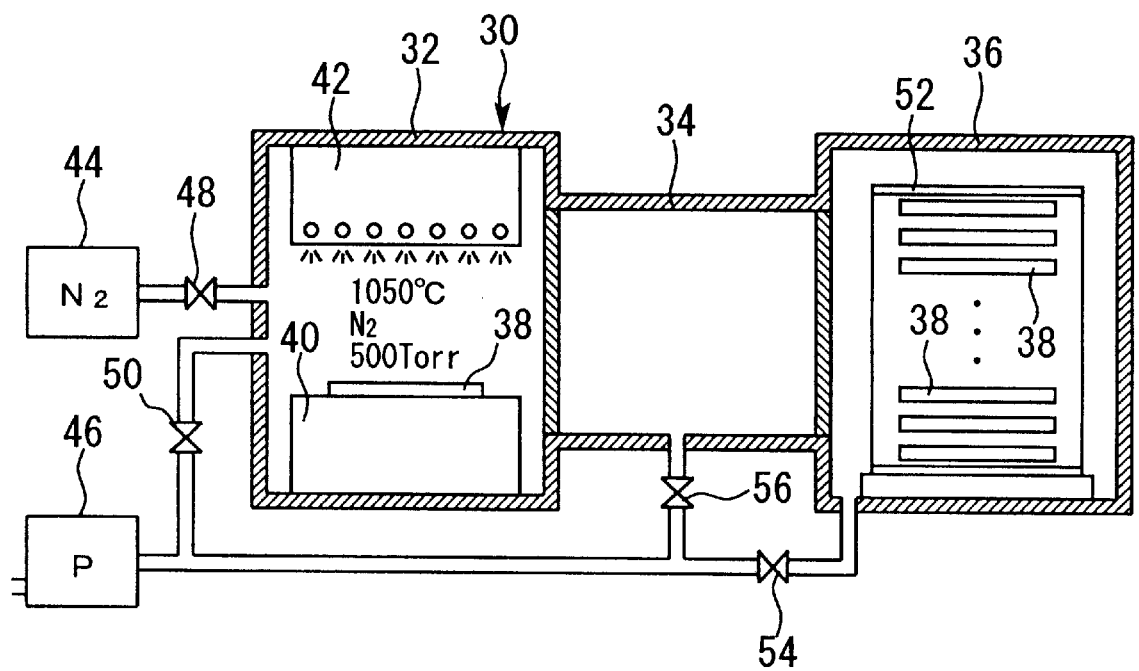
FIG. 3 is a schematic view showing a thermal treating apparatus used in the first embodiment of the invention.

FIG. 3 shows a thermal treating apparatus 30 used in the method of this embodiment. The thermal treating apparatus 30 includes a treatment chamber 32, a transfer chamber 34, and a stage chamber 36. These chambers are all partitioned from one another by means of a shutter (not shown) or the like capable of being opened and closed. When the shutter is opened, a wafer 38 can be transferred to or received from an adjacent chamber.

The treatment chamber 32 is an RTA device of a single wafer processing type wherein the temperature of the wafer 38 on a table 40 can be quickly raised or quickly lowered. Inside the treatment chamber 32, there is arranged a lamp heater 42 for RTA treatment, with which the wafer 38 can be entirely, uniformly heated. In the treatment chamber 32, an $N_2$ gas feed unit 44 and a reduced pressure pump 46 are communicated via control valves 48, 50, respectively.

A wafer cassette 52 holding a plurality of wafers 38 is accommodated in the stage chamber 36. The wafer 38 held in the wafer cassette 52 is transferred to a treatment chamber 30 through a transfer chamber 34 by means of a transfer arm not shown. The wafer 38, which has been thermally treated in the treatment chamber 30, is returned to the wafer cassette 52 via the transfer chamber 34. In this embodiment, the reduced pressure pump 46 is communicated to the stage chamber 36 and the transfer chamber 34 through control valves 54, 56, respectively.

In the thermal treating apparatus 30, the wafer 38 is transferred inside the treatment chamber 32 before lamp annealing is carried out for 30 seconds under conditions of a treating temperature of 1050° C. and a pressure of 500 Torr in an atmosphere of $N_2$. When the pressure in the treatment chamber 32 is so reduced as set out above, residual oxygen inside the chamber can be efficiently exhausted, so that it is effectively prevented that Si is etched in the course of the annealing or an SiO gas is generated. Moreover, when the annealing operation is performed while reducing pressure by means of the reduced pressure pump 46 an SiO gas, which may be produced within the treatment chamber 32, can be efficiently discharged to outside. Thus, according to the method of this embodiment, it can be effectively suppressed that the minute foreign matter 24 is formed on the surface of the wafer 38 during the course of the lamp annealing.

Figure 4:
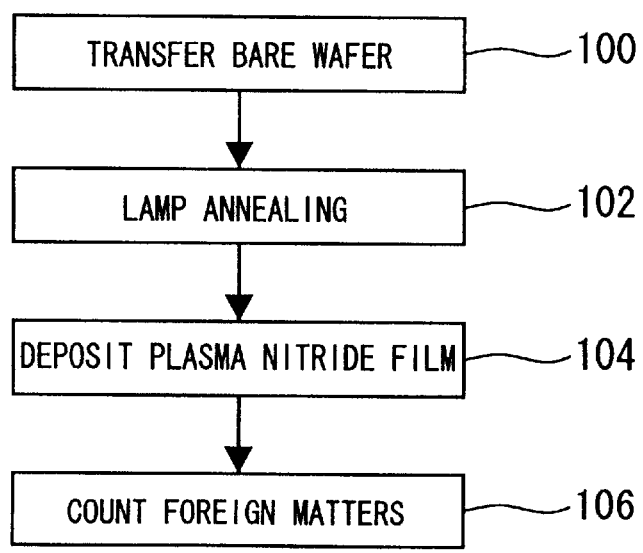
FIG. 4 is a flow chart illustrating a procedure of a check test for confirming the effect of the method of the first embodiment according to the invention.

FIG. 4 is a flow chart showing the procedure of a check test for confirming the effect of the method according to this embodiment. In the check test, a target of lamp annealing is a bare wafer, i.e. a wafer wherein silicon was exposed to over the entire surface. The bare wafer is transferred to the treatment chamber 32 (step 100).

Next, the bare wafer was subjected to lamp annealing under conditions of the first embodiment (i.e. 1050° C., an atmosphere of $N_2$, 500 Torr, and 30 seconds) (step 102).

Since the minute foreign matter 24 formed by reaction between the silicon and the residual oxygen has a diameter as small as about 0.1 μm, it is not necessarily easy to directly detect the existence of the foreign matter 24. Accordingly, in order to enlarge the minute foreign matter 24 in the check test, a plasma nitride film was deposited after the lamp annealing (step 104).

Thereafter, the number of foreign matters deposited on the bare wafer surface was counted (step 106). The results of the check test reveal that for the known lamp annealing under an atmospheric pressure, several thousands to several tens of thousands of foreign matters were observed, while for the lamp annealing in the embodiment of the invention, foreign matters could be reduced to a level of several tens. It was confirmed that when the pressure at the time of the lamp annealing was within a range of 5 Torr to 750 Torr, this effect could be obtained substantially in the same manner as in the case using the conditions of the first embodiment.

As shown in FIG. 3, the thermal treating apparatus 30 used in this embodiment can reduce the inner pressure of the treatment chamber 32, and can also lower the inner pressures of the transfer chamber 34 as well as the stage chamber 36. When the transfer chamber 34 and the stage chamber 36 are reduced in pressure along with the reduction in pressure of the treatment chamber 32, the amount of the moisture carried with the wafer 38 is suppressed, so that the amount of the residual oxygen in the treatment chamber 32 can be further suppressed. Accordingly, the reduction in pressure not only of the treatment chamber, but also of the transfer chamber 34 and the stage chamber 36 is effective in suppressing the production of the minute foreign matters 24.

In the first embodiment stated hereinabove, the lamp annealing of the wafer 38 is carried out in a reduced pressure atmosphere of nitrogen, to which the atmosphere for lamp annealing is not limited. For instance, the atmosphere for lamp annealing may be a reduced pressure atmosphere of an inert gas such as Ar.

The major benefits of the present invention described above are summarized as follows:

According to the first aspect or the present invention, the atmosphere in a treatment chamber is a reduced pressure atmosphere of an inert gas, so that residual oxygen in the treatment chamber can be efficiently reduced. This entails a suppressed amount of generation of an SiO gas caused by the thermal treatment, and thus the amount of production of minute foreign matters formed on the wafer surface can be effectively suppressed.

According to the second aspect of the present invention, the pressure within the treatment chamber is defined at a level of 750 Torr or below, the formation of minute foreign matters in the course of the thermal treatment can be effectively prevented.

According to the third aspect of the present invention, the thermal treatment of the wafer is performed by use of a short time thermal annealing apparatus (RTA apparatus), thereby completing the thermal treatment or annealing of the wafer efficiently within a short time.

Further, the present invention is not limited to these embodiments, but variations and modifications may be made without departing from the scope of the present invention.

The entire disclosure of Japanese Patent Application No. 2000-25564 filed on Feb. 2, 2000 including specification, claims, drawings and summary are incorporated herein by reference in its entirety.

What is claimed is:

1. A method for manufacturing a semiconductor device, comprising the sequential steps of:

transferring a wafer having an exposed portion of silicon to a thermal treatment chamber;

reducing an atmosphere of the thermal treatment chamber to a reduced pressure of an inert gas; and subjecting said wafer to thermal treatment in the reduced pressure atmosphere of an inert gas;

wherein the step of transferring said wafer to the treatment chamber includes the step of automatically transferring a wafer held in a stage chamber via a transfer chamber; and said method further comprising the steps of:

reducing an atmosphere wherein the wafer is held in the stage chamber to a reduced pressure; and reducing an atmosphere of the transfer chamber to a reduced pressure.

2. The method according to claim 1, wherein the reduced pressure is 750 Torr or below.

3. The method according to claim 2, wherein the reduced pressure is 5 Torr to 750 Torr.

4. The method according to claim 1, wherein the thermal treatment is rapid thermal annealing.

5. The method according to claim 1, comprising thermally treating the wafer to activate an impurity.

6. The method according to claim 1, wherein the reduced pressure is sufficient to reduce residual oxygen thereby suppressing production of an SiO gas during thermal treatment and, thereby, suppressing the production of minute foreign matter.

* * * * *